(12) United States Patent
Engelhardt

(10) Patent No.: US 8,993,422 B2
(45) Date of Patent: Mar. 31, 2015

(54) PROCESS TOOLS AND METHODS OF FORMING DEVICES USING PROCESS TOOLS

(71) Applicant: Infineon Technologies AG, Neubiberg (DE)

(72) Inventor: Manfred Engelhardt, Villach-Landskron (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/670,402

(22) Filed: Nov. 6, 2012

(65) Prior Publication Data

US 2014/0134829 A1    May 15, 2014

(51) Int. Cl.
*H01L 21/67* (2006.01)
*H01L 21/3065* (2006.01)
*H01J 37/32* (2006.01)

(52) U.S. Cl.
CPC ....... *H01L 21/3065* (2013.01); *H01J 37/32009* (2013.01); *H01J 37/32651* (2013.01)
USPC .................. 438/513; 438/710; 438/716

(58) Field of Classification Search
CPC ............. H01L 21/67; H01L 21/67069; H01L 21/0262
USPC .................................. 438/513, 710
See application file for complete search history.

(56) References Cited

U.S. PATENT DOCUMENTS

| | | | | |
|---|---|---|---|---|
| 4,511,593 A | * | 4/1985 | Brandolf | 427/562 |
| 7,371,689 B2 | * | 5/2008 | Kane et al. | 438/710 |
| 2008/0099426 A1 | * | 5/2008 | Kumar et al. | 216/12 |
| 2012/0270406 A1 | * | 10/2012 | Tahara et al. | 438/710 |

* cited by examiner

*Primary Examiner* — Alexander Ghyka
(74) *Attorney, Agent, or Firm* — Slater & Matsil, L.L.P.

(57) ABSTRACT

In accordance with an embodiment of the present invention, a process tool includes a chuck configured to hold a substrate. The chuck is disposed in a chamber. The process tool further includes a shielding unit with a central opening. The shielding unit is disposed in the chamber over the chuck.

24 Claims, 11 Drawing Sheets

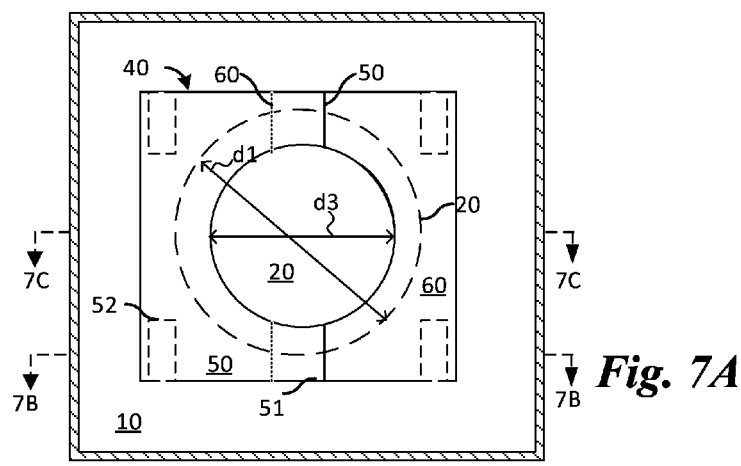
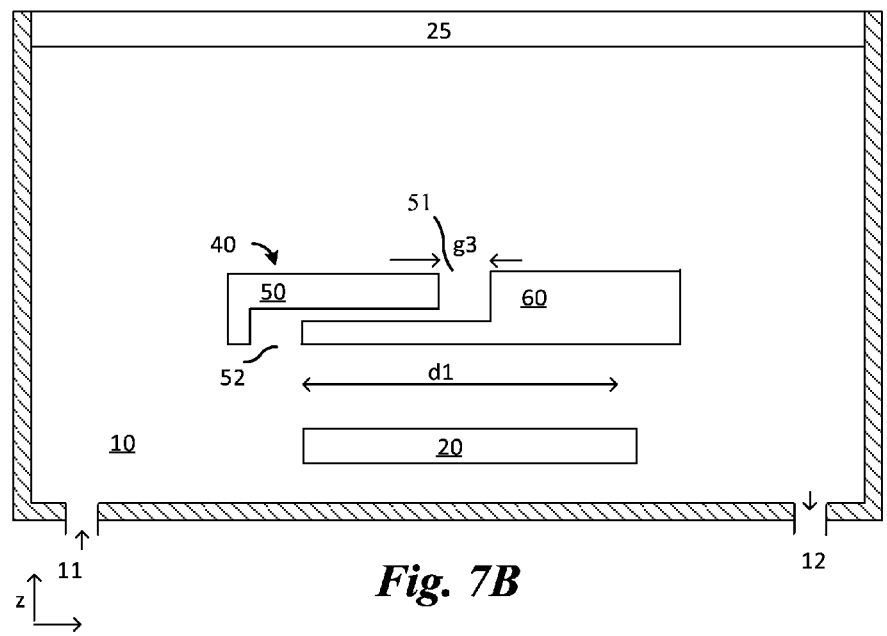

PROCESS TOOLS AND METHODS OF FORMING DEVICES USING PROCESS TOOLS

TECHNICAL FIELD

The present invention relates generally to manufacturing, and more particularly to process tools and methods of forming devices using process tools.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Success of the semiconductor industry requires delivering higher performance at lower cost. Consequently, maintaining production costs within reasonable levels is one of the primary challenges in semiconductor manufacturing.

Improving product quality is another challenge in manufacturing semiconductor devices. For example, process tools have to maintain across wafer and within wafer uniformity despite increasing wafer sizes. As feature sizes are continually scaled along with wafer size, there exists a continuous need to improve process flow and tools.

Thus, process tools have to reduce production cost, for example, lower processing time (or increase through put) and lower down time (or maintenance time), but at the same time improve product quality. Continued success of the semiconductor industry requires overcoming these and other limitations.

SUMMARY OF THE INVENTION

These and other problems are generally solved or circumvented, and technical advantages are generally achieved, by illustrative embodiments of the present invention.

In accordance with an embodiment of the present invention, a process tool comprises a chuck configured to hold a substrate. The chuck is disposed in a chamber. The process tool further includes a shielding unit with a central opening. The shielding unit is disposed in the chamber over the chuck.

In accordance with an embodiment of the present invention, a top electrode, a chuck disposed below the top electrode, and a shield disposed between the chuck and the top electrode. The shield is configured to overlap with a peripheral region of the chuck.

In accordance with an embodiment of the present invention, a method of forming a device comprises placing a substrate over a chuck of a chamber, and positioning a shield between a plasma source and the chuck. The shield covers a peripheral region of the chuck. The substrate is exposed to a plasma from the plasma source.

In accordance with an embodiment of the present invention, a method of forming a device comprises placing a first substrate having a first diameter over a chuck of a chamber, positioning a shield over the chuck in a first position. The shield covers a first peripheral region of the chuck. The first substrate is removed from the chamber. A second substrate having a second diameter is placed over the chuck of the chamber. The shield is positioned over the chuck in a second position. The shield covers a second peripheral region of the chuck. The first peripheral region is different from the first peripheral region.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a plasma tool in accordance with an embodiment of the present invention, wherein FIG. 1A is a top plan view and FIG. 1B is a cross sectional view of a plasma chamber of the plasma tool;

FIG. 2, which includes FIGS. 2A and 2B, illustrates the plasma tool illustrated in FIG. 1 in accordance with an embodiment of the present invention, wherein FIG. 2A is a top plan view and FIG. 2B is a cross sectional view of a plasma chamber of the plasma tool;

FIG. 3, which includes

FIG. 4, which includes

FIG. 5, which includes FIGS. 5A-5D, illustrates a cross-sectional view of the plasma shield in accordance with an embodiment of the invention, wherein FIGS. 5A-5D are cross-sectional views of the plasma shield as illustrated by the line 5-5 in FIG. 1A;

FIG. 6, which includes

FIG. 7, which includes FIGS. 7A-7C, illustrates a further alternative embodiment of the plasma shield configured for multiple wafer sizes;

FIG. 8, which includes FIG. 9, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Semiconductor scaling has resulted, amongst other things, in the scaling of wafer sizes. Wafer sizes have increased with every couple of technology nodes to enable manufacturing more number of dies in parallel so as to decrease the cost per die. For example, the wafer size has increased from 6 inch to 8 inch, and now to 12 inch. Further, it is expected that 18 inch wafers will be introduced in future technology nodes. Frequently, in many fabrication facilities, many technology nodes are concurrently processed. However, conventional plasma tools such as plasma etching tools and/or plasma vapor deposition systems are compatible with only a single wafer size. In such instances, different tools have to be maintained which takes up valuable floor space increasing production costs. Embodiments of the invention overcome these problems and others by using a single tool to run wafers of different sizes.

An embodiment of a process tool will be described using FIGS. 1 and 2. A method of processing wafers using the process tool will be described using FIGS. 3 and 4. Alternative embodiments of the process tool will be described using FIG. 5, FIGS. 6-7, and FIG. 8, FIG. 9.

Figure 1A:
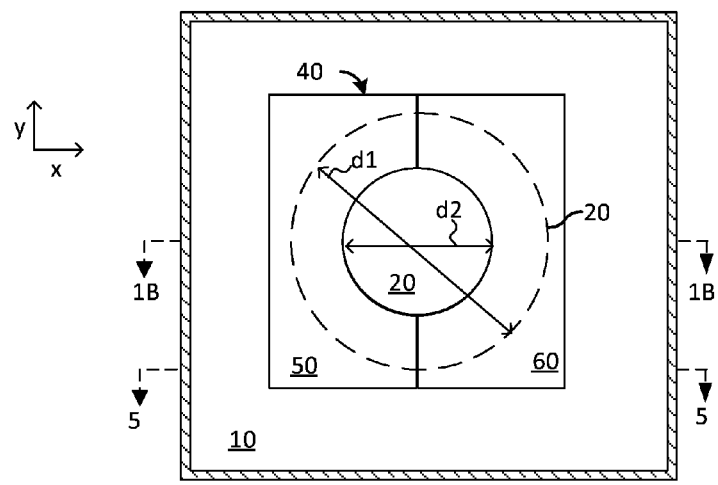
Figure 1B:
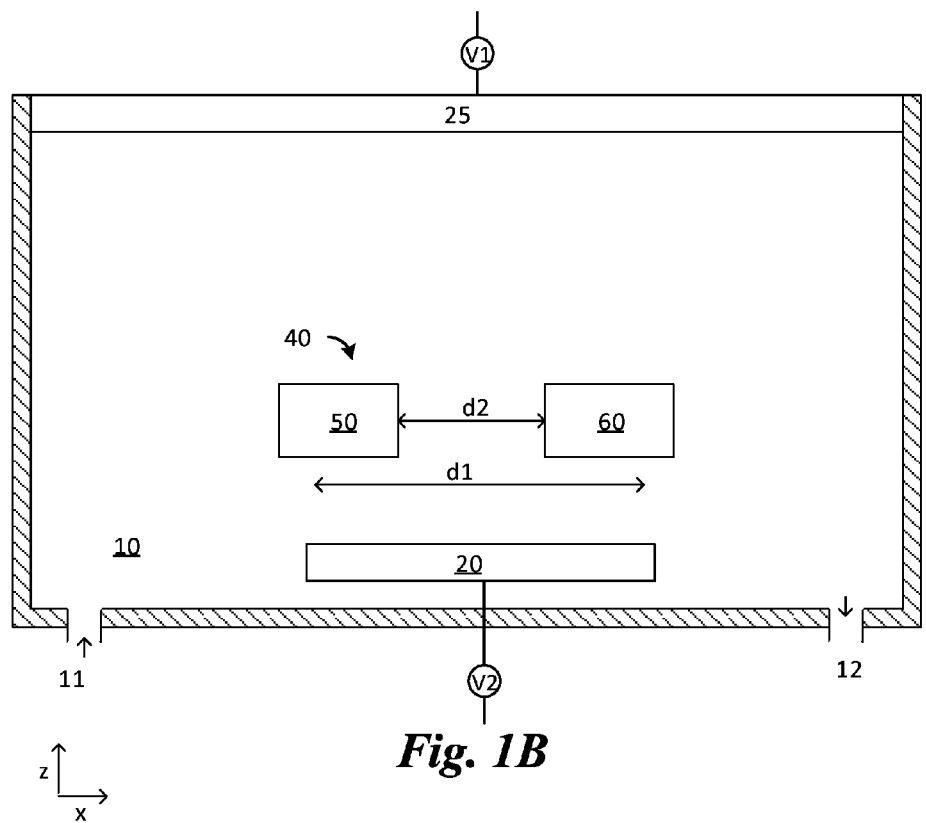

FIG. 1, which includes FIGS. 1A and 1B, illustrates a plasma tool in accordance with an embodiment of the present invention. FIG. 1A is a top plan view and FIG. 1B is a cross sectional view of a plasma chamber of the plasma tool.

Referring to FIG. 1A, the plasma tool includes a plasma chamber 10. The plasma chamber 10 may be a suitable chamber and may be lined with an inert material such as quartz. The plasma chamber 10 is designed to provide a clean environment for processing wafers without generating additional residues due to reaction with the components of the plasma chamber 10. The plasma chamber 10 may include inlet and outlet for gases generating the plasma. For example, as illustrated in FIG. 1B, the plasma chamber 10 includes a gas inlet 11 and a gas outlet 12.

A plasma etching system is a type of etching in which the plasma is used to provide directional etching. In a plasma etching system, a high electrode field is applied across the plasma chamber 10. A reactant gas comprising an etchant is used within the plasma chamber 10. The high electric field ionizes the atoms of the reactant gas producing positive ions and free electrons thereby creating a plasma within the plasma chamber 10.

Referring to FIG. 1B, the energy for the plasma is supplied via a RF generator which usually operates at 13.56 MHz, for example, by applying a RF voltage at the first voltage node V1 at the top electrode 25 or at the second voltage node V2 at the chuck 20. The high energy electrons from the plasma may cause a variety of reactions with the reactant gases. As a consequence, the plasma may include free electrons, ionized molecules, free radicals, and/or neutral molecules. The reactant gas in the plasma chamber 10 may be introduced through the gas inlet 11 and may be maintained at low pressure (e.g., 10 mTorr to about 100 mTorr) to minimize ion collisions during transit of the ions, for example, to improve the directionality of the etching process. In plasma etching systems, the ionized etchant gas atoms are accelerated towards the substrate positioned over the chuck 20. The directional motion of the ionized etchant gas atoms results in anisotropic etching of the exposed substrate (wafer). However, any portion of the chuck 20 that is not covered by the substrate is also exposed to the highly corrosive ionized etchant gas atoms. Over a period of time, repeated exposure to the ionized etchant gas atoms can result in permanent damage to the chuck 20. Replacing the chuck 20 is expensive and may need a significant amount of time before the plasma etch system can become functional again. Embodiments of the present invention overcome these and other limitations by the use of the plasma shield 40.

Similarly, in a plasma vapor deposition system, an inert gas such as argon is fed into the plasma chamber 10 at low pressures. A voltage is applied across the plasma chamber 10 generating a plasma comprising ionized inert gas atoms, for example, by applying a first voltage node V1 at the top electrode 25 and a second voltage node V2 at the chuck 20. These ionized inert atoms are attracted or accelerated by the electric field in the chamber to strike a target electrode, e.g., top electrode 25. The target atoms are physically dislodged from their host lattice and thrown into the plasma chamber 10. The free target atoms travel through the plasma chamber 10. Some of these free target atoms strike a substrate (wafer) over the chuck 20. The deposition rate of the film on the wafer depends on the number of incident ions, the sputter yield (number of target atoms dislodged per incident ion), and geometrical factors (for example, relationship of target relative to the wafer). However, a large fraction of the free target atoms hit other surfaces such as any exposed surface of the chuck 20 (surface of the chuck 20 not covered by the substrate). If the chuck 20 is exposed in this manner, the chuck 20 may have to be replaced within a very number of cycles because of the deposited target atoms on the periphery of the chuck 20. The chuck 20 is expensive to replace and may result in significant down time for the tool, which increases production costs further. Embodiments of the present invention overcome these and other limitations by the use of the plasma shield 40.

In various embodiments, the plasma chamber 10 includes a plasma shield 40 comprising a first retractable plate 50 and the second retractable plate 60. In various embodiments, more number of retractable plates may be used. In various embodiments, the plasma shield 40 comprises a material that is resistant to the plasma chemistry. In one or more embodiments, the plasma shield 40 comprises a ceramic material. For example, the plasma shield 40 is unaffected even when exposed to ionized etchant atoms in the plasma etching system. Alternatively, the plasma shield 40 may be replaced easily and less expensively than the replacement of the chuck 20.

As illustrated in the top view, in the fully closed position, the plasma shield 40 has a circular opening. In the illustration, the chuck 20 has a first diameter d1. In various embodiments, the circular opening has a second diameter d2, which is about the same as the diameter of the substrate being processed. For example, to process a 6 inch wafer, the circular opening (second diameter d2) is 6 inch.

In various embodiments, the plasma shield 40 is disposed between the plasma source and the chuck 20. Thus, in various embodiments, the peripheral region of the chuck 20 (region of the chuck 20 not overlapping with the central opening of the plasma shield 40) are not exposed to the ionized etchant gas atoms. Therefore, advantageously, the peripheral region of the chuck 20 is not bombarded by the reactive ionized etchant gas atoms thereby protecting the chuck 20.

Thus, embodiments of the present invention allow processing wafers of different sizes by changing the relative size of the central opening of the plasma shield 40.

Figure 2A:
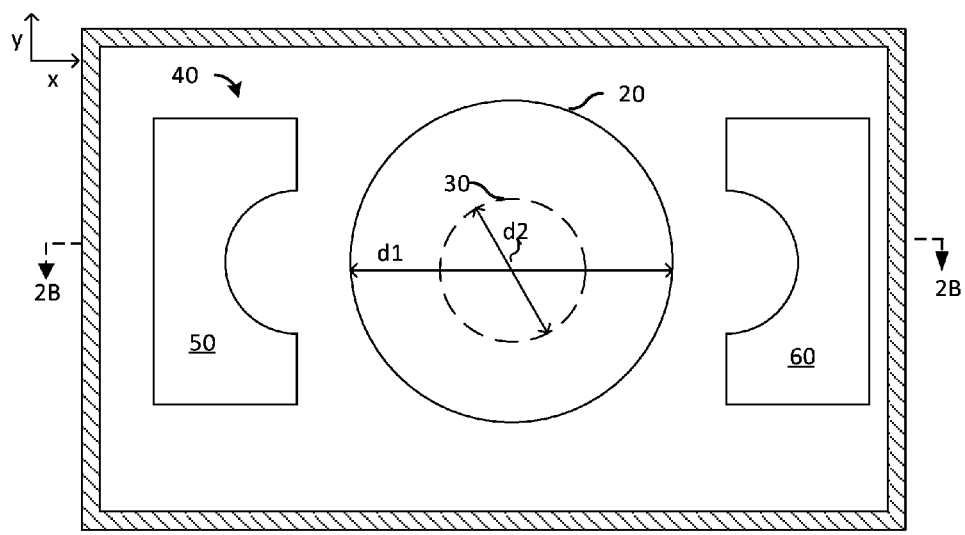
Figure 2B:
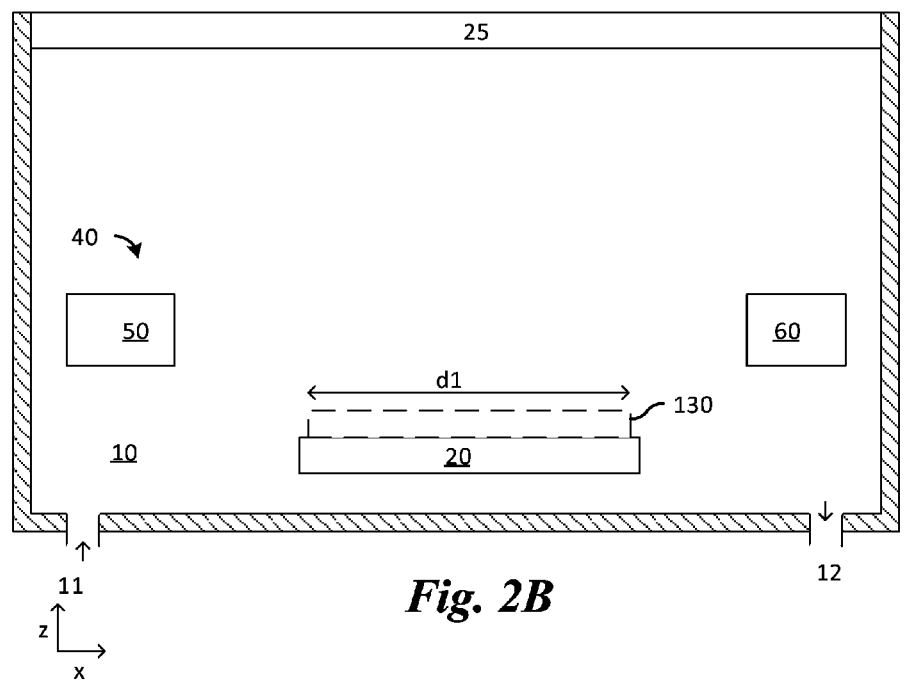

FIG. 2, which includes FIGS. 2A and 2B, illustrates the plasma tool illustrated in FIG. 1 in accordance with an embodiment of the present invention. FIG. 2A is a top plan view and FIG. 2B is a cross sectional view of a plasma chamber of the plasma tool.

The plasma tool illustrated in FIG. 1 may be configurable such that multiple wafer sizes may be accommodated. While FIG. 1 illustrated a first position of the plasma shield 40 in which a substrate smaller than the chuck 40 may be used without exposing the peripheral regions of the chuck 40 to the plasma. In contrast, in FIG. 2, the plasma shield 40 is retracted to a second position. In this embodiment, the plasma shield 40 does not protect the chuck 40 because it is moved out of the way between the plasma source and the chuck 20. This position may be used when the wafer has the same size as the chuck 20, i.e., the size of the chuck 20 is about the same as the wafer size. In FIG. 2A, the second diameter d2 (from FIG. 1) is overlaid to illustrate the relative change in the central opening from FIG. 1.

FIG. 3, which includes FIG. 3A-3D, illustrates a device during various stages of processing in a plasma etch tool in accordance with embodiments of the present invention. In various embodiments, FIGS. 3A-3D may illustrate a semiconductor device during fabrication.

Figure 3A:
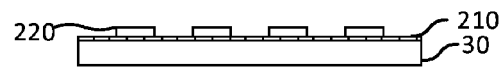
FIG. 3A-3D, illustrates a wafer having a first size during various stages of processing in a plasma etch tool in accordance with embodiments of the present invention.

FIG. 3A illustrates a first substrate 30 prior to processing in the plasma etch tool. The first substrate 30 may be a wafer having a first diameter d1 in one or more embodiments. The first substrate 30 may comprise a semiconductor material in various embodiments. The first substrate 30 may comprise a bulk silicon wafer in one embodiment, for example, having a (100) planar surface. In another embodiment, the first substrate 30 may comprise a silicon on insulator wafer. In further embodiments, the first substrate 30 may comprise other semiconductor materials (or layers of) such as a germanium, silicon germanium, silicon carbide, gallium nitride, gallium arsenide, indium phosphide, indium arsenide, and others. The first substrate 30 may include one or more epitaxial layers.

The first substrate 30 may include a layer 210 to be patterned. The layer 210 may comprise a dielectric layer in one embodiment. In one embodiment, the layer 210 comprises an oxide, tetra ethyl oxysilane (TEOS), fluorinated TEOS (FTEOS), doped glass (borophosphosilicate glass (BPSG), phosphosilicate glass (PSG), borosilicate glass (BSG)). In another embodiment, the layer 210 comprises a nitride, a high-k dielectric material such as hafnium based oxide such as hafnium oxide, hafnium silicon oxide, hafnium silicon oxynitride (HfSiON), aluminum oxide, and combinations thereof. In another embodiment, the layer 210 comprises a low-k dielectric such as organo silicate glass (OSG), fluorinated silicate glass (FSG), or spin-on glass (SOG), carbon doped oxides (CDO), dense SiCOH or porous dielectrics.

In another embodiment, the layer 210 may comprise a conductive material such as a metal. For example, the layer 210 may comprise aluminum, copper, titanium, tantalum, tungsten, gold, metal oxides, metal silicides, metal nitrides. In yet another embodiment, the layer 210 may comprise a semiconductor material layer such as a poly-crystalline semiconductor layer. In various embodiments, the layer 210 may comprise a plurality of layers.

A patterned resist 220 may be formed over the layer 210. The patterned resist 220 may comprise a photoresist in one or more embodiments. The patterned resist 220 may be formed using a conventional lithography process in one or more embodiments. For example, the resist 220 may be deposited and developed after a lithographic exposure process.

Figure 3B:
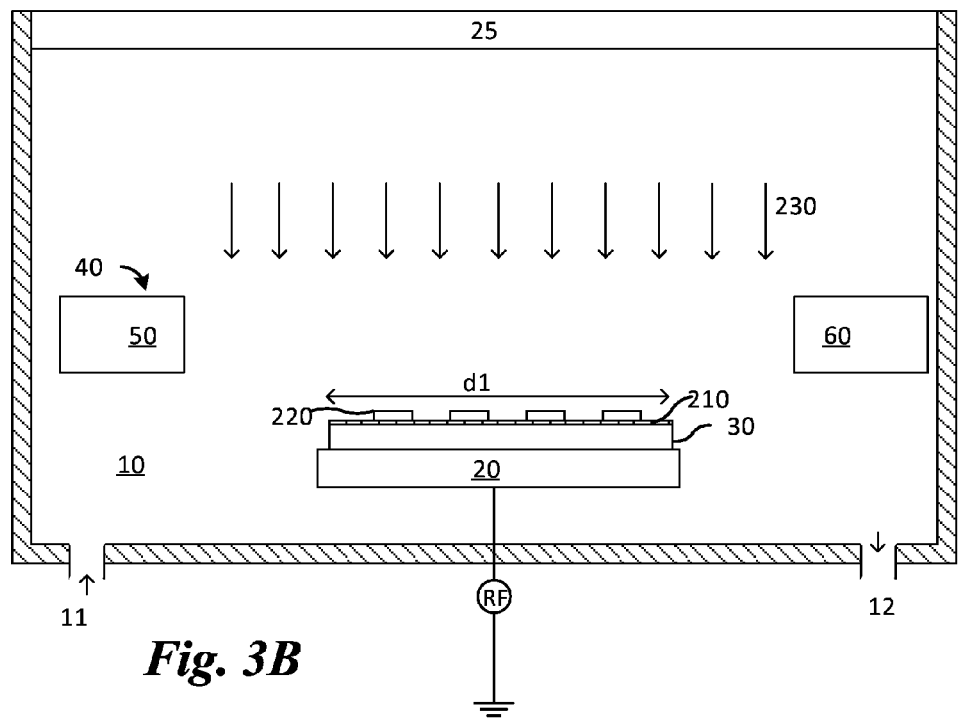

FIG. 3B illustrates processing the first substrate 30 in the plasma etch tool. The plasma etch system comprises a target electrode 25 (or cathode) connected to a voltage node, an anode or chuck 20 powered by a RF voltage bias, on which the first substrate 30 is placed. In various embodiments, the plasma etch tool may be a parallel plate plasma etch system, a high density plasma etch system, a sputter etching system, or other types of plasma etching systems. In a high density plasma etch system, the plasma may be generated using electron cyclotron resonance and inductively coupled plasma. In high density plasma etch systems, the plasma density is very high, for example, greater than about $10^{11}$ cm$^{-3}$. In some embodiments, the plasma etch system may comprise a sputter etching, which is physical bombardment of the layer 210 with chemically inert ions. For example, in sputter etching, ionized argon atoms may be bombarded onto the layer 210.

Depending on the chemistry of the etching process, gases are introduced through the gas inlet 11 and removed through the gas outlet 12. In various embodiments, the gases may include argon, fluorine based chemistries such as $SiF_4$, fluorocarbons such as $CF_4$, $CHF_3$, $C_2F_6$, $C_3F_8$, $C_4F_8$, $CH_2F_2$, oxygen, hydrogen, $NF_3$, CO, chlorine based chemistries such as $Cl_2$, $CHCl_3$, and combinations thereof.

Due to the potential difference between the chuck 20 and the top electrode 25, the ionized etchant gas atoms 230 are accelerated towards the chuck 20. As illustrated, the ionized etchant gas atoms 230 from the plasma are directed towards the first substrate 30. Thus, the directionality of the etching process depends, amongst others, on the potential drop and the etchant gas. More reactive species result in selective etching while using an inert gas such as argon provides directional etching without selectivity. Thus, in various embodiments, the anisotropic etching process patterns the exposed layer 210.

Figure 3C:
Figure 3D:

As next illustrated in FIG. 3C, the first substrate 30 is removed from the plasma chamber 10. Any remaining patterned resist 220 may be removed, for example, using a wet etch process to form a patterned layer 240 (FIG. 3D).

FIG. 4, which includes FIGS. 4A-4D, illustrates a device during various stages of processing in the plasma etch tool in accordance with embodiments of the present invention. In various embodiments, FIGS. 4A-4D may illustrate a semiconductor device during fabrication.

Figure 4A:
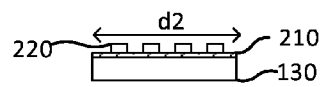
FIGS. 4A-4D, illustrates a wafer having a second size during various stages of processing in a plasma etch tool in accordance with embodiments of the present invention.

FIG. 4A illustrates a second substrate 130 prior to processing in the plasma etch tool. The second substrate 130 may be a wafer having a second diameter d2 in one or more embodiments. The second substrate 130 may comprise a semiconductor material in various embodiments. The second diameter d2 is smaller than the first diameter d1. The second substrate 130 may comprise a bulk silicon wafer in one embodiment, for example, having a (100) planar surface. In another embodiment, the second substrate 130 may comprise a silicon on insulator wafer. In further embodiments, the second substrate 130 may comprise other semiconductor materials (or layers of) such as a germanium, silicon germanium, silicon carbide, gallium nitride, gallium arsenide, indium phosphide, indium arsenide, and others. The second substrate 130 may include one or more epitaxial layers.

Similar to FIG. 3, the second substrate 130 includes a layer 210 to be patterned. As described previously, layer 210 may be a dielectric material, a conductive material, or a semiconductor.

Figure 4B:
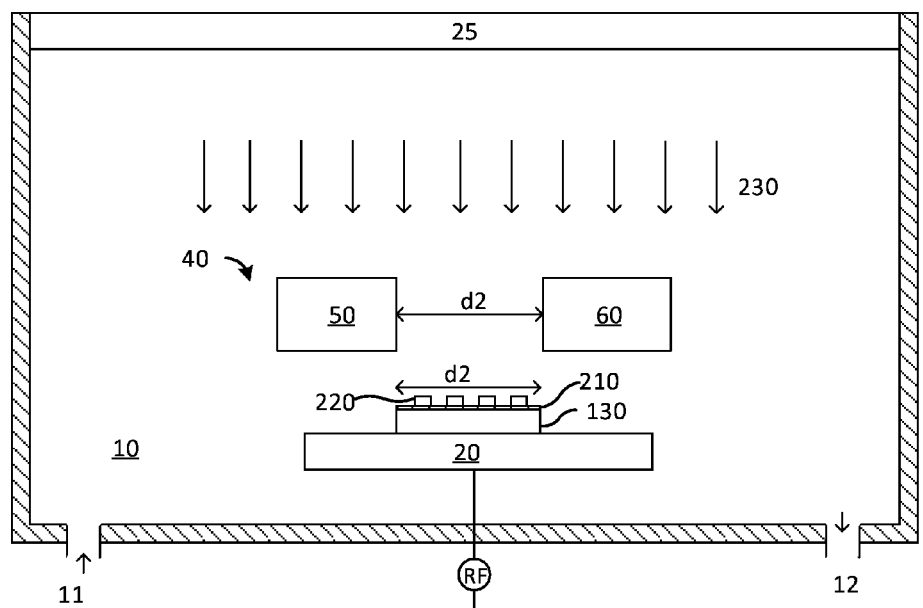

Referring to FIG. 4B, the second substrate 130 is placed within the plasma chamber 10 of the plasma etch tool. The second substrate 130 is positioned over the chuck 20.

In this embodiment, the second substrate 130 has a second diameter d2, which is smaller than the chuck 20. Thus, as illustrated in FIG. 4B, the second substrate 130 does not completely cover the chuck 20. Rather, only a central portion of the chuck 20 is covered with the second substrate 130. The remaining peripheral region of the chuck 20 is exposed and may be damaged if continuously exposed to the corrosive ionized gas atoms 230 of the plasma. Therefore, in various embodiments, the plasma shield 40 is deployed to protect the chuck 20. Using embodiments of the present invention, the peripheral regions of the chuck 20 are protected by the plasma shield 40. Thus, the chuck 20 is not harmed even in high density plasma etch systems, which may have very high ion flux directed towards the chuck 20.

Referring to FIG. 4B, the plasma shield 40 is deployed by bringing the retractable plates closer. For example, in case of the embodiment in which the plasma shield 40 includes a first retractable plate 50 and a second retractable plate 60, the first and the second retractable plates 50 and 60 are brought closer into a position to form a central opening having a second diameter d2 (e.g., see also FIG. 1A). Thus, the first and the second retractable plates 50 and 60 protect the peripheral regions of the chuck 20 not covered by the second substrate 130 from the ionized gas atoms 230.

In various embodiments of the invention, the plasma shield 40 is not coupled to a potential and therefore does not change the process itself. Introducing a potential on the plasma shield 40 may introduce a negative impact as some of the ionized gas atoms 230 may be diffracted, which may impact directionality, uniformity, and/or ability to protect the peripheral regions of the chuck 20.

In various embodiments, the plasma shield 40 comprises a material, which has minimal impact on the electric field lines within the plasma chamber 10. This is because a significant change in the electric field lines may reduce the directionality of the ionized gas atoms 230 while also increasing the flux of ionized gas atoms 230 hitting the plasma shield 40. In other words, the capacitance of the plasma shield 40 is about the same as the capacitance of the corresponding space of the plasma chamber 10. Accordingly, the plasma shield 40 comprises a low-k material in one embodiment. Alternatively or additionally, in various embodiments, the thickness of the plasma shield 40 is minimized while maintaining mechanical stability. In one or more embodiments, the plasma shield 40 has a thickness, measured along the z direction, less than 10 mm. In various embodiments, the plasma shield 40 has a thickness between about 1 mm to about 10 mm.

In various embodiments, the plasma shield 40 comprises a ceramic material and may include a metallic layer coated over a ceramic substrate. In various embodiments, the ceramic material comprises quartz, glass, and other materials.

In various embodiments, the plasma shield 40 comprises a conductive substrate, for example comprising a metal. For example, the plasma shield 40 may comprise a stainless steel substrate, a copper substrate, a lead substrate, a tungsten substrate as examples. The metal may be in an alloy form, an intermetallic, and/or as compounds. For example, a metal inert to ionized gas atoms 230 of the plasma may be used in various embodiments. Alternatively, in another embodiment, the plasma shield 40 comprises a metal substrate coated with a dielectric material. In another embodiment, the plasma shield 40 comprises a ceramic coated with a metal. For example, the ceramic material may be coated with TiN or TaN.

Figure 4C:
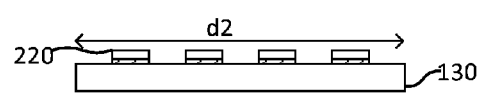
Figure 4D:
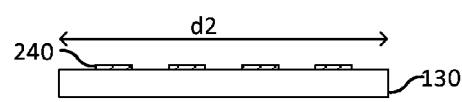

After etching the exposed layer 210 on the second substrate 130, the etching process is completed. The second substrate 130 is removed from the plasma chamber 10 as illustrated in FIG. 4C and any remaining resist is removed to form a patterned layer 240 (FIG. 4D).

In various embodiments, the process described in FIG. 3 may be performed prior to or after performing the process described in FIG. 4. For example, a first lot of wafers comprising wafers of the first diameter (e.g., 12 inch) may be processed as illustrated in FIG. 3. Then, a second lot of wafers comprising wafers of the second diameter (e.g., 6 inch) may be processed as illustrated in FIG. 4. Thus, different lots of wafers having different wafer sizes may be processed within the same process tool.

FIG. 5, which includes FIGS. 5A-5D, illustrates a cross-sectional view of the plasma shield in accordance with an embodiment of the invention. FIG. 5 is a cross-sectional view of the plasma shield as illustrated by the line 5-5 in FIG. 1A.

Figure 5A:
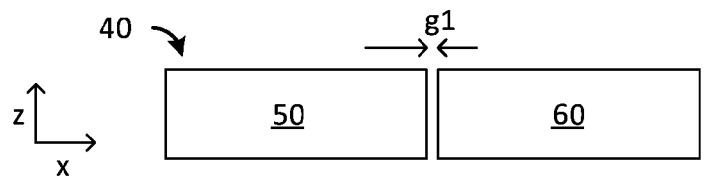

As illustrated in FIG. 5A, in one embodiment, the first retractable plate 50 is disposed proximate the second retractable plate 60. However, the first retractable plate 50 is spaced apart from the second retractable plate 60 by a first gap g1. The first gap g1 is at least few millimeters, and about 5 mm to about 50 mm in various embodiments. In one embodiment, the first gap g1 is about 10 mm to about 20 mm. In one or more embodiments, the first gap g1 is about 0.5 mm to about 2 mm. In one or more embodiments, the first gap g1 is about 1 mm or less. The first gap g1 ensures that the first retractable plate 50 does not rub or collide with the second retractable plate 60. Such a design may prevent generation of unwanted particles that can contaminate the wafer being processed. Thus, embodiments of the invention prevent an increase in defect density by preventing rubbing of the plates of the plasma shield 40.

Figure 5B:
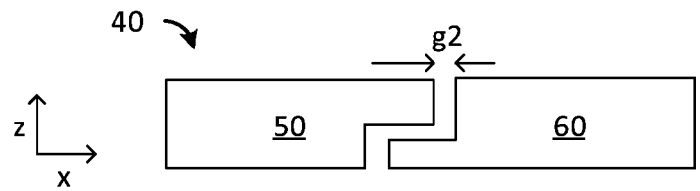

FIG. 5B illustrates an alternative embodiment of the plasma shield 40. In this embodiment, the ionized plasma is prevented from reaching the chuck through the gap. In the embodiment of FIG. 5A, a small portion of the chuck 20 under the first gap g1 is not protected from the ionized gas atoms of the plasma. In this embodiment, an interlocking design is used for the plasma shield 40 such that all regions of the chuck 20 are protected from any direct bombardment by the ionized gas atoms. Thus, the portion of the chuck 20 under the second gap g2 is also protected from the ionized gas atoms because of the overlapping design of the second retractable plate 60.

Further, the interlocking design enables the use of multiple spacing between the first retractable plate 50 and the second retractable plate 60. Thus, this embodiment may be used to process wafers of multiple sizes.

Figure 5C:
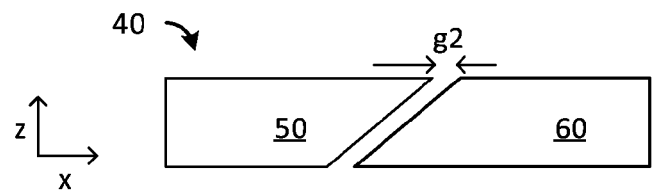

FIG. 5C illustrates an alternative embodiment of the plasma shield 40 in which the first retractable plate 50 and the second retractable plate 60 have a sidewall inclined at an angle relative to the top surface. In particular, the sidewalls of the first retractable plate 50 and the second retractable plate 60 are not perpendicular thereby protecting the underlying chuck 20.

Figure 5D:
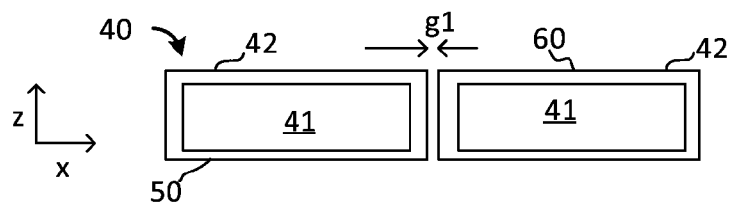

FIG. 5D illustrates an alternative embodiment of the plasma shield 40 in which the plasma shield included an inner core material and an outer coating. In one or more embodiments, the plasma shield 40 comprises a core region 41 and a coating 42 forming an outer layer over the core region 41. The core region 41 may be a metal substrate in one embodiment. In another embodiment, the core region 41 comprises a ceramic substrate. The coating 42 may be a conformal layer deposited on all surfaces of the core region 41 in various embodiments. However, in some embodiments, the coating 42 may be formed only on the major surface facing the plasma ions. In various embodiments, the coating 42 may comprise more than one layer. In various embodiments, the coating 42 may comprise a metal, or a dielectric layer.

Figure 6A:
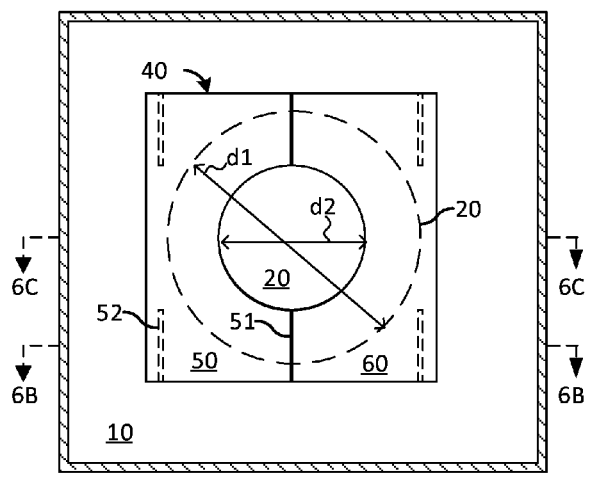
FIGS. 6A-6C, illustrates a further alternative embodiment of the plasma shield.
Figure 6B:
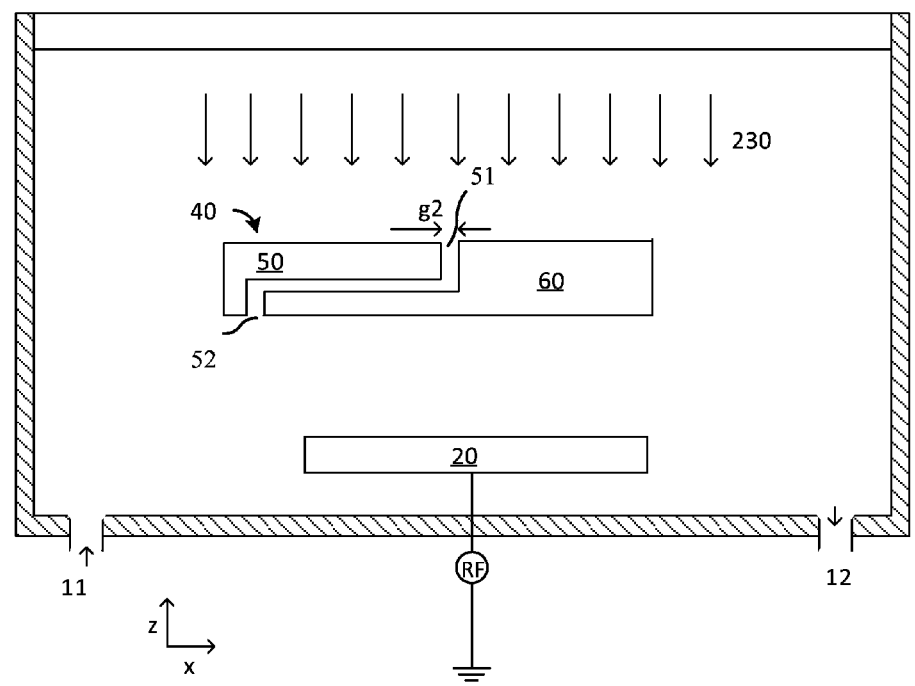
Figure 6C:
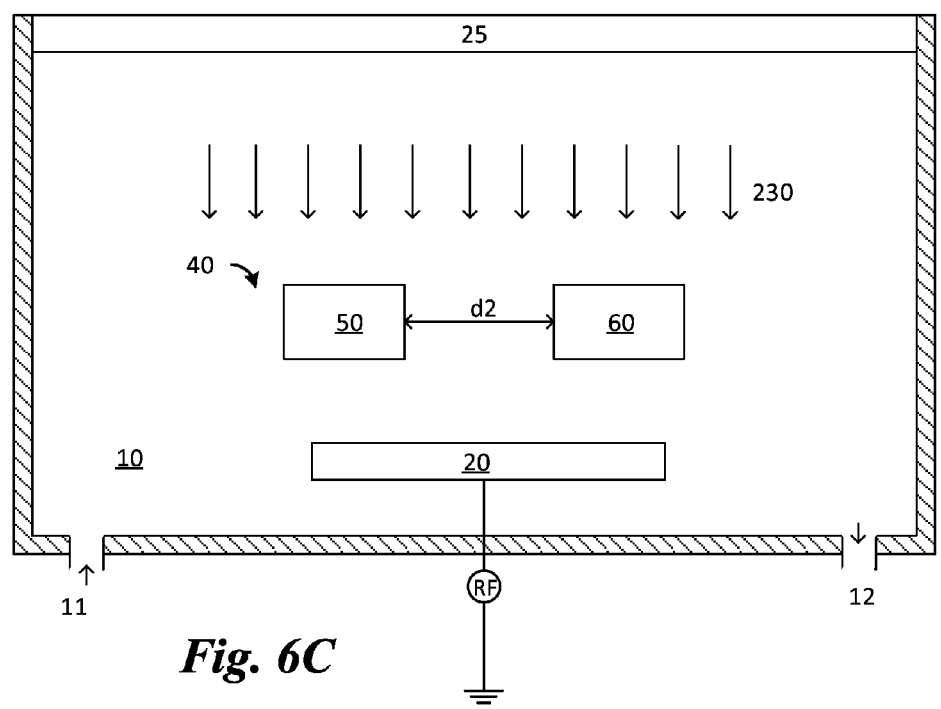

FIG. 6, which includes FIGS. 6A-6C, illustrates a further alternative embodiment of the plasma shield. FIG. 6B is a cross-sectional view of the plasma shield as illustrated by the line 6B-6B of FIG. 6A. FIG. 6C is a cross-sectional view of the plasma shield as illustrated by the line 6C-6C of FIG. 6A.

In another embodiment, the plasma shield 40 includes an interlocking design having a top opening 51 and an opposite bottom opening 52 (FIG. 6A). The bottom opening 52 is moved to the peripheral of the plasma shield 40. As a consequence, the etching chemical falling through the top opening 51 is transported through the plasma shield 40 and exits out of the plasma shield 40 at a location, which may not overlap with the chuck 20 (FIG. 6B). Thus, the chuck 20 is protected from the chemical action of the etchant as well. In the prior embodiment illustrated in FIG. 5B, the chuck 20 is protected from the physical bombardment but may be subjected to the chemical action as the etchant may fall over the chuck 20.

Figure 7C:
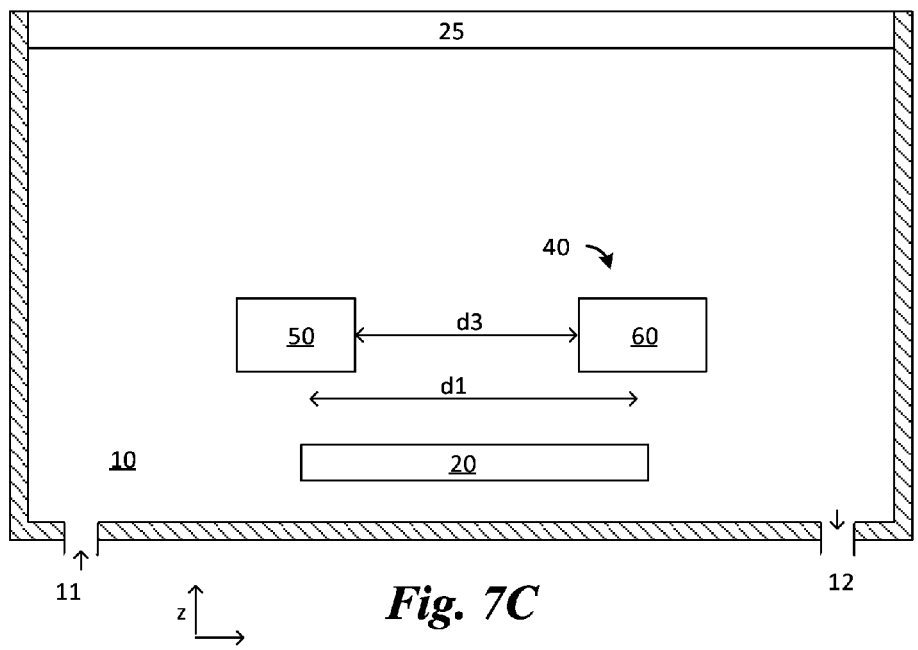

FIG. 7, which includes FIGS. 7A-7C, illustrates a further alternative embodiment of the plasma shield configured for multiple wafer sizes. FIG. 7A is a top plan view of the plasma shield. FIG. 7B is a cross-sectional view of the plasma shield as illustrated by the line 7B-7B of FIG. 7A. FIG. 7C is a cross-sectional view of the plasma shield as illustrated by the line 7C-7C of FIG. 7A.

FIG. 7 illustrates the plasma shield previously illustrated in FIG. 6 positioned to fit a wafer having a third diameter d3 different from the second wafer diameter d2 in FIG. 6. Thus, the first and the second retractable plates 50 and 60 of the plasma shield 40 are spaced apart by a third gap g3 (FIG. 7B), which is bigger than the second gap g2 illustrated in FIG. 6B.

Figure 8A:
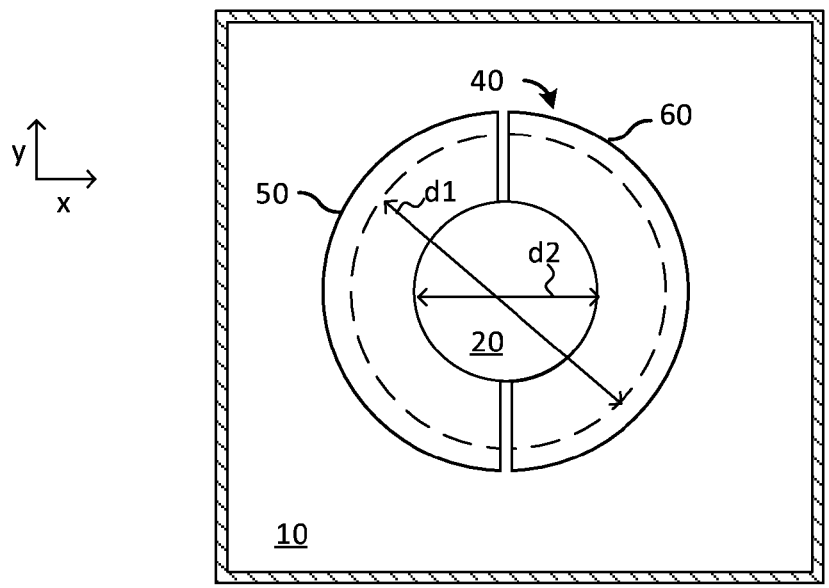
FIGS. 8A-8B, illustrates top plan views of a plasma shield having angular plates in accordance with alternative embodiments of the present invention.
Figure 8B:
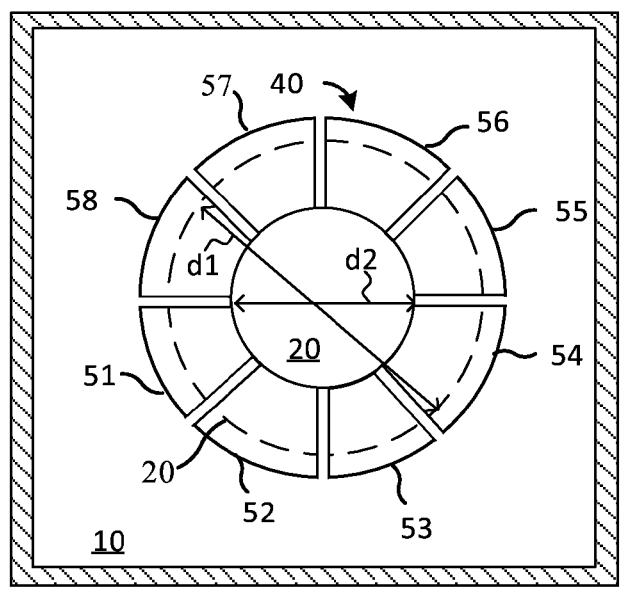

FIG. 8, which includes FIGS. 8A-8B, illustrates a top plan view of a plasma shield having angular plates in accordance with alternative embodiments of the present invention.

In various embodiments, the plasma shield 40 may comprise plates having different shapes and sizes. For example, in one embodiment illustrated in FIG. 8A, the plasma shield 40 may include semicircular plates. In this embodiment, the first and the second retractable plates 50 and 60 are both semicircular.

FIG. 8B illustrates an alternative embodiment illustrating multiple pie shaped retractable plates. Thus, this embodiment may be used to configure the plasma shield 40 to adjust the inner openings so that different wafer sizes may be accommodated. Accordingly, the plasma shield 40 includes a first plate 51, a second plate 52, a third plate 53, a fourth plate 54, a fifth plate 55, a sixth plate 56, a seventh plate 57, and an eighth plate 58. In various embodiments, more or less number of plates may be used.

Figure 9A:
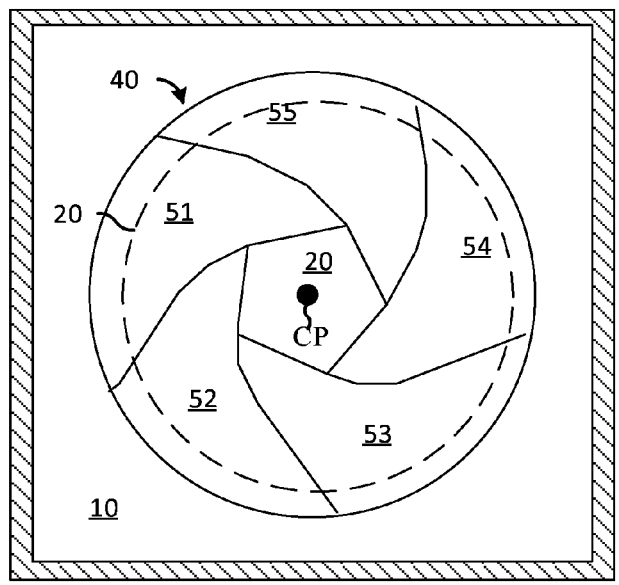
FIGS. 9A-9C, illustrates a top plan view of a plasma shield having angular plates in accordance with alternative embodiments of the present invention.
Figure 9B:
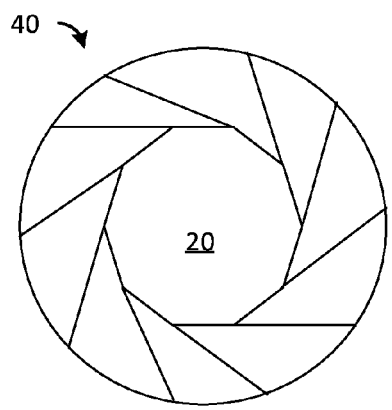
Figure 9C:
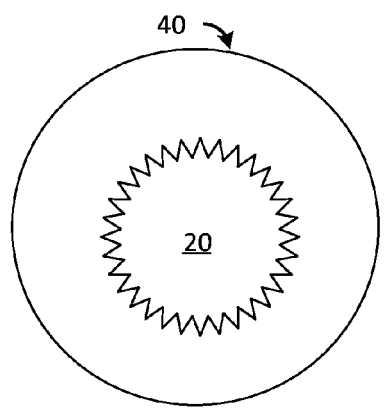

FIG. 9, which includes FIGS. 9A-9C, illustrates a top plan view of a plasma shield having angular plates in accordance with alternative embodiments of the present invention.

FIG. 9A illustrates an alternative arrangement of the plates of the plasma shield. In various embodiments, the plates of the plasma shield 40 may be arranged differently to enable variation in wafer sizes easily. Accordingly, in one or more embodiments, the plasma shield 40 may include iris like shapes. For example, in the illustrated embodiment, a first plate 51, a second plate 52, a third plate 53, a fourth plate 54, and a fifth plate 55 are positioned to form a central opening, a pentagon. The plates may be rotated around a central point (CP), which increases or decreases the size of the central opening depending on the arrangement. For example, in FIG. 9A, a clockwise rotation reduces the diameter of the central opening.

In various embodiments, more number of plates may be added. For example, in various embodiments, nine, ten, or fourteen, or twenty plates may be used. Five plates are shown only as an illustration. The increase in number of plates results in the formation of a more circular shaped polygon. As another illustration, when ten plates are used as illustrated in FIG. 9B, the central opening of the plasma shield 40 has a shape of a decagon. FIG. 9C illustrates a further illustration of a plasma shield 40 having 32 plates (each of the plates is not shown for clarity).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-9 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a device, the method comprising:
   placing a first substrate over a chuck of a chamber;
   positioning a shield between a plasma source and the chuck, the shield covering a first peripheral region of the chuck, wherein the shield includes a central opening exposing a central region of the chuck;
   adjusting a diameter of the central opening to a first opening size; and
   after adjusting the diameter of the central opening to the first opening size, exposing the first substrate to a first plasma from the plasma source, wherein the shield blocks a direct path of the first plasma to the first peripheral region without blocking a direct path of the first plasma to the first substrate during the exposing;
   removing the first substrate from over the chamber; and
   after removing the first substrate, adjusting the diameter of the central opening of the shield to a second opening size, wherein the shield is configured to operate with wafers of different diameters by changing the diameter of the central opening, wherein the central opening of the shield is adjusted from the first opening size to the second opening size before exposing another substrate.

2. The method of claim 1, further comprising:
   wherein adjusting the diameter of the central opening of the shield to the second opening size comprises retracting the shield to expose the first peripheral region of the chuck;
   placing a second substrate over the chuck; and
   exposing the second substrate to a second plasma from the plasma source.

3. The method of claim 2, wherein the first substrate and the second substrate have different diameter.

4. The method of claim 2, wherein the first substrate is a 6 inch or smaller diameter wafer, and wherein the second substrate is an 8 inch or larger diameter wafer.

5. The method of claim 1, further comprising:
removing the first substrate from over the chuck;
placing a second substrate over the chuck of the chamber;
positioning the shield to cover a second peripheral region of the chuck, the second peripheral region being different from the first peripheral region of the chuck; and
exposing the second substrate to a second plasma from the plasma source.

6. The method of claim 1, wherein exposing the first substrate comprises etching a layer of the first substrate.

7. The method of claim 1, wherein exposing the first substrate comprises depositing a layer over the first substrate.

8. A method of forming a device, the method comprising:
placing a first substrate having a first diameter over a first central region of a chuck of a chamber to expose a first peripheral region of the chuck, the first peripheral region surrounding the first central region, wherein a major surface area of first substrate is parallel to the major surface of the chuck after placing the first substrate;
positioning a shield over the chuck in a first position, the shield covering the first peripheral region of the chuck;
removing the first substrate from the chamber;
placing a second substrate having a second diameter over a second central region of the chuck of the chamber to expose a second peripheral region of the chuck, the second peripheral region surrounding the second central region, wherein a major surface area of second substrate is parallel to the major surface of the chuck after placing the second substrate; and
positioning the shield over the chuck in a second position, the shield covering the second peripheral region of the chuck, the first peripheral region having a different area along the major surface of the chuck than the second peripheral region.

9. The method of claim 8, further comprising:
before removing the first substrate, exposing the first substrate to a first plasma within the chamber; and
after placing the second substrate over the chuck, exposing the second substrate to a second plasma within the chamber.

10. The method of claim 8, wherein exposing the first substrate comprises etching a layer of the first substrate.

11. The method of claim 8, wherein exposing the first substrate comprises depositing a layer over the first substrate.

12. The method of claim 1, wherein the shield comprises a plurality of plates.

13. The method of claim 12, further comprising rotating the plurality of plates so as to expose the first peripheral region of the chuck.

14. The method of claim 12, further comprising retracting the plurality of plates so as to expose the first peripheral region of the chuck.

15. The method of claim 1, wherein the shield comprises a ceramic substrate.

16. The method of claim 15, wherein the ceramic substrate is coated with a conductive layer.

17. The method of claim 1, wherein the shield comprises a metal substrate.

18. The method of claim 1, wherein the shield comprises a first retractable plate configured to be set to a first position and a second position.

19. The method of claim 18, wherein the shield further comprises a second retractable plate, wherein, in the first position, the first retractable plate is proximate to the second retractable plate.

20. The method of claim 19, wherein, in the first position, a portion of the first retractable plate overlaps a portion of the second retractable plate.

21. The method of claim 20, wherein, in the first position, the shield has an outlet facing the chuck, the outlet not overlapping with the chuck.

22. A method of forming a device, the method comprising:
placing a first substrate over a chuck of a chamber, wherein the first substrate overlaps with a first central region of the chuck to expose a first peripheral region of the chuck, wherein a major surface area of first substrate is parallel to a major surface of the chuck after placing the first substrate;
positioning a shield between a plasma source and the chuck, the shield overlapping with the first peripheral region of the chuck;
exposing the first substrate to a first plasma from the plasma source, wherein, during the exposing of the first substrate, the shield blocks a direct path of the first plasma to the first peripheral region without blocking a direct path of the first plasma to the first substrate during the exposing;
removing the first substrate from over the chuck;
retracting the shield to expose the first peripheral region of the chuck;
placing a second substrate over the chuck; and
exposing the second substrate to a second plasma from the plasma source while keeping the shield retracted, wherein the shield exposes the second substrate without blocking a direct path of the second plasma to the first peripheral region, wherein the diameter of the first substrate is different from the diameter of the second substrate.

23. A method of forming a device, the method comprising:
positioning a shield between a plasma source and a chuck of a chamber, wherein the shield includes a central opening;
adjusting a diameter of the central opening of the shield to a first opening size; and
after adjusting the diameter of the central opening to the first opening size, exposing a first substrate disposed over the chuck to a first plasma from the plasma source while blocking a first peripheral region of the chuck outside the first substrate from direct exposure to the first plasma;
removing the first substrate from over the chamber; and
after removing the first substrate, adjusting the diameter of the central opening of the shield to a second opening size different from the first opening size; and
after adjusting the diameter of the central opening to the second opening size, exposing a second substrate disposed over the chuck to a second plasma from the plasma source while blocking a second peripheral region of the chuck outside the second substrate from direct exposure to the second plasma.

24. The method of claim 23, wherein the first substrate is a 6 inch or smaller diameter wafer, and wherein the second substrate is an 8 inch or larger diameter wafer.

* * * * *